(12) United States Patent
Takeya

(10) Patent No.: US 11,658,161 B2
(45) Date of Patent: May 23, 2023

(54) DISPLAY DEVICE

(71) Applicant: Seoul Semiconductor Co., Ltd., Ansan-si (KR)

(72) Inventor: Motonobu Takeya, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 103 days.

(21) Appl. No.: 17/177,050

(22) Filed: Feb. 16, 2021

(65) Prior Publication Data

US 2021/0167043 A1    Jun. 3, 2021

Related U.S. Application Data

(63) Continuation of application No. 17/010,682, filed on Sep. 2, 2020, now Pat. No. 11,502,065, which is a (Continued)

(51) Int. Cl.
*H01L 25/075*    (2006.01)

(52) U.S. Cl.
CPC ...... *H01L 25/075* (2013.01); *H01L 2933/005* (2013.01); *H01L 2933/0033* (2013.01); *H01L 2933/0066* (2013.01)

(58) Field of Classification Search
CPC .......... H01L 21/6838; H01L 21/67144; H01L 21/6835; H01L 25/075; H01L 25/0753; (Continued)

(56) References Cited

U.S. PATENT DOCUMENTS 7,795,629 B2    9/2010    Watanabe et al.
8,426,227 B1    4/2013    Bibl et al.
(Continued)

FOREIGN PATENT DOCUMENTS

KR    10-2010-0045980    5/2010
KR    10-2012-0087505    8/2012
(Continued)

OTHER PUBLICATIONS

Final Office Action dated May 27, 2022, in U.S. Appl. No. 17/010,682.
(Continued)

*Primary Examiner* — Nikolay K Yushin
(74) *Attorney, Agent, or Firm* — H.C. Park & Associates, PLC

(57) ABSTRACT

A method of manufacturing a display apparatus including the steps of providing a plurality of light emitting diode chips on a first manufacturing substrate, placing a transferring plate above the light emitting diode chips, bonding a plurality of adhesive transferring portions disposed on the transferring plate to a portion of the light emitting diode chips disposed on the first manufacturing substrate, separating the portion of the light emitting diode chips from the first manufacturing substrate, coupling the portion of the light emitting diode chips disposed on the transferring plate to a plurality of first and second substrate electrodes disposed on a substrate, and separating the transferring plate from the portion of the light emitting diode chips coupled to the substrate, in which the adhesive transferring portions are regularly arranged in rows and columns on the transferring plate.

7 Claims, 17 Drawing Sheets

Related U.S. Application Data continuation of application No. 16/489,358, filed as application No. PCT/KR2018/002688 on Mar. 7, 2018, now Pat. No. 10,937,768.

(60) Provisional application No. 62/470,499, filed on Mar. 13, 2017.

(58) Field of Classification Search
CPC ....... H01L 25/50; H01L 25/167; H01L 33/62; H01L 33/005; H01L 33/40; H01L 33/00; H01L 2221/68368; H01L 2221/68322; H01L 2221/68354; H01L 2221/68381; H01L 2933/0066; H01L 2933/0033; H01L 2933/005

See application file for complete search history.

(56) References Cited

U.S. PATENT DOCUMENTS

| | | | |
|---|---|---|---|
| 8,592,232 | B2 | 11/2013 | Suh et al. |
| 9,391,233 | B2 | 7/2016 | Cho et al. |
| 10,068,888 | B2 | 9/2018 | Zhang et al. |
| 10,224,307 | B2 | 3/2019 | Zou et al. |
| 11,205,677 | B2 | 12/2021 | Zou et al. |
| 2005/0233504 | A1 | 10/2005 | Doi et al. |
| 2010/0171215 | A1* | 7/2010 | Fischer ................... H01L 24/95 257/734 |
| 2012/0313241 | A1 | 12/2012 | Bower |
| 2013/0026518 | A1* | 1/2013 | Suh ....................... H01L 33/507 257/E33.061 |
| 2015/0372187 | A1 | 12/2015 | Bower et al. |
| 2017/0179097 | A1 | 6/2017 | Zhang et al. |
| 2017/0330856 | A1 | 11/2017 | Zou et al. |
| 2020/0152693 | A1 | 5/2020 | Zou et al. |

FOREIGN PATENT DOCUMENTS

| | | |
|---|---|---|
| KR | 10-2014-0095794 | 8/2014 |
| KR | 10-2014-0108228 | 9/2014 |
| KR | 10-2015-0074321 | 7/2015 |

OTHER PUBLICATIONS

Non-Final Office Action dated Jan. 10, 2022, issued to U.S. Appl. No. 17/010,682.
International Search Report dated Jun. 14, 2018, issued in International Patent Application No. PCT/KR2018/002688.
Non-Final Office Action dated Jul. 31, 2020, issued to U.S. Appl. No. 16/489,358.
European Search Report dated Dec. 16, 2020, issued to European Patent Application No. 18767802.4.
Notice of Allowance dated Jan. 8, 2021, in U.S. Appl. No. 16/489,358.
Notice of Allowance dated Aug. 3, 2022, issued to U.S. Appl. No. 17/010,682.

* cited by examiner

DISPLAY DEVICE

CROSS-REFERENCE TO RELATED APPLICATIONS

This application is a Continuation of U.S. patent application Ser. No. 17/010,682, filed on Sep. 2, 2020, which is a Continuation of U.S. patent application Ser. No. 16/489,358, filed on Aug. 28, 2019, which is a National Stage Entry of International Patent Application No. PCT/KR2018/002688, filed on Mar. 7, 2018, and claims priority from and the benefit of U.S. Provisional Patent Application No. 62/470,499, filed on Mar. 13, 2017, each of which is hereby incorporated by reference for all purposes as if fully set forth herein

BACKGROUND

Field

Exemplary embodiments of the present invention relate to a method of manufacturing a display apparatus, and, more particularly, to a method of transferring a light emitting diode chip to a substrate for manufacturing a display apparatus.

Discussion of the Background

A light emitting diode refers to an inorganic semiconductor device that emits light through recombination of electrons and holes. In recent years, light emitting diodes have been used in various fields including displays, automobile lamps, general lighting, and the like. Light emitting diodes have various advantages, such as longer lifespan, lower power consumption, and quicker response than conventional light sources. As such, light emitting devices using a light emitting diode are replacing existing light sources quickly.

Recent display apparatuses, such as TVs, monitors, or electronic display boards, display colors through a thin film transistor liquid crystal display (TFT-LCD) panel, and employ light emitting diodes as a light source of a backlight unit for emission of the realized colors. Various studies have been conducted to develop a display apparatus capable of displaying colors directly through light emitting diodes, instead of using an LCD.

In order to use light emitting diodes as a light source of a backlight unit, or for direct realization of colors, one light emitting diode may be provided for each pixel. In this case, in order to control each of the light emitting diodes, an active matrix (AM) drive type or a passive matrix (PM) drive type may be employed. In the AM drive type, the luminous area of each light emitting diode being about $1/10,000$ of the area of one pixel may be sufficient, and for the PM drive type, the luminous area of each light emitting diode being about $1/100$ of the area of one pixel may be sufficient.

However, light emitting diodes having an excessively large luminous area have a problem of low current density, causing deterioration in luminous efficacy. As such, light emitting diodes having a small luminous area with respect to a pixel area are typically being used, such that the current density flowing through the light emitting diodes may be increased while satisfying the luminous efficacy in the pixel.

However, as the luminous area becomes smaller, the size of the light emitting diodes becomes also smaller. As such, mounting a large number of light emitting diodes, or replacing the light emitting diodes, which have a small luminous area increases manufacturing complexity.

The above information disclosed in this Background section is only for understanding of the background of the inventive concepts, and, therefore, it may contain information that does not constitute prior art.

SUMMARY

Methods of manufacturing a display apparatus using a light emitting diode package according to exemplary embodiments of the invention are capable of increasing the yield of mounting and repairing a light emitting diode, even when the light emitting diode has a small luminous area with respect to a pixel area of the display apparatus.

Additional features of the inventive concepts will be set forth in the description which follows, and in part will be apparent from the description, or may be learned by practice of the inventive concepts.

A method of manufacturing a display apparatus according to an exemplary embodiment includes the steps of forming a plurality of light emitting diode chips on a first manufacturing substrate, coupling the plurality of the light emitting diode chips onto a second manufacturing substrate, separating the first manufacturing substrate from the plurality of the light emitting diode chips, and transferring the plurality of light emitting diode chips coupled onto the second manufacturing substrate to a substrate including first and second substrate electrodes.

The method of manufacturing the display apparatus may further include the step of irradiating the first manufacturing substrate with a laser to separate the plurality of light emitting diode chips from the first manufacturing substrate while the plurality of light emitting diode chips are coupled to the second manufacturing substrate.

The transferring step may include coupling the plurality of light emitting diode chips to a third manufacturing substrate, separating the second manufacturing substrate from the plurality of light emitting diode chips, coupling the plurality of light emitting diode chips to the plurality of first and second substrate electrodes, and separating the third manufacturing substrate from the plurality of light emitting diode chips.

The second manufacturing substrate may have elasticity, and the transferring step may further include elongating the second manufacturing substrate along a first direction, and in the step of coupling the plurality of light emitting diode chips to the third manufacturing substrate, the plurality of light emitting diode chips disposed on the elongated second manufacturing substrate may be coupled to the third manufacturing substrate.

The transferring step may include absorbing a portion of the plurality of light emitting diode chips coupled to the second manufacturing substrate with a transmission device, performing at least one of heating and ultrasonic-irradiating the second manufacturing substrate so as to separate the portion of the plurality of light emitting diode chips absorbed on the transmission device from the second manufacturing substrate, coupling a portion of the absorbed light emitting diode chips to the substrate, and separating the transfer device from the plurality of light emitting diode chips coupled to the substrate.

The transferring step may include bonding a portion of the plurality of light emitting diode chips coupled to the second manufacturing substrate to a transferring plate having a plurality of adhesive transferring portions, coupling a portion of the plurality of light emitting diode chips bonded to the transfer plate to the substrate, and separating the transferring plate from the plurality of light emitting diode chips coupled to the substrate.

An interval of the plurality of light emitting diode chips formed on the first manufacturing substrate may be the same as an interval of sub-pixels to which the plurality of light emitting diode chips are to be mounted.

An interval of the plurality of first and second substrate electrodes may be the same as an interval of sub-pixels to which the plurality of light emitting diode chips are to be mounted.

Forming the plurality of light emitting diode chips may include forming a first conductivity type semiconductor layer, an active layer, and a second conductivity type semiconductor layer on the first manufacturing substrate, exposing a portion of the first conductivity type semiconductor layer, forming first and second electrodes on the first and second conductivity type semiconductor layers, respectively, forming an encapsulant to cover the first and second electrodes, and forming first and second bumps electrically connected to the first and second electrodes on the encapsulant, respectively.

A method of manufacturing a display apparatus according to another exemplary embodiment includes the steps of forming a plurality of light emitting diode chips on a first manufacturing substrate, and transferring at least a portion of the plurality of light emitting diode chips formed on the first manufacturing substrate to a substrate on which a plurality of first and second substrate electrodes are disposed.

The method of manufacturing the display apparatus may further include the step of irradiating the first manufacturing substrate with a laser to separate the plurality of light emitting diode chips from the first manufacturing substrate, in which the portion of the plurality of light emitting diode chips partially separated by the laser are transferred to the substrate.

The transferring step may include coupling the portion of the plurality of light emitting diode chips formed on the first manufacturing substrate to the first and second substrate electrodes, and separating the first manufacturing substrate from the portion of the plurality of light emitting diode chips coupled to the substrate.

Forming the plurality of light emitting diode chips may include forming a light emitting structure including a first conductivity type semiconductor layer, an active layer, and a second conductivity type semiconductor layer on the first manufacturing substrate, exposing a portion of the first conductivity type semiconductor layer, forming first and second electrodes on the first and second conductivity type semiconductor layers, respectively, forming an encapsulant to cover the light emitting structure and the first and second electrodes, and forming first and second bumps electrically connected to the first and second electrodes on the encapsulant, respectively.

The encapsulant may be formed continuously on the first manufacturing substrate between adjacent light emitting diode chips.

An interval between the plurality of first and second substrate electrodes may be the same as an interval between sub-pixels to which the plurality of light emitting diode chips are to be mounted.

A method of manufacturing a display apparatus according to yet another exemplary embodiment includes providing a light emitting structure on a first substrate, the light emitting structure including a plurality of light emitting diode chips spaced apart from each other at a first interval and being adhered to the first substrate, coupling at least a portion of the light emitting structure provided on the first substrate to a second substrate, selectively transferring only a first portion of the light emitting diode chips to the second substrate by separating the first substrate from the first portion of the light emitting diode chips, the second substrate including bonding portions respectively overlapping the first portion of the light emitting diode chips, in which the bonding portions cause the first portion of the light emitting diodes chips to be adhered to the second substrate when the first substrate is separated from the first portion of the light emitting diode chips.

The first portion of the light emitting diode chips may be spaced apart from each other at a second interval greater than the first interval.

The light emitting structure may further include an encapsulation layer continuously covering each of the light emitting diode chips and contacting the first substrate to be adhered to the first substrate.

The method may further include irradiating the first substrate with a laser to substantially separate the light emitting diode chips from the first substrate, while the encapsulation layer adjoins the light emitting diode chips to the first substrate.

The bonding portions may cause the encapsulation layer to be disconnected when the first substrate is removed from the first portion of the light emitting diodes chips.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1A:
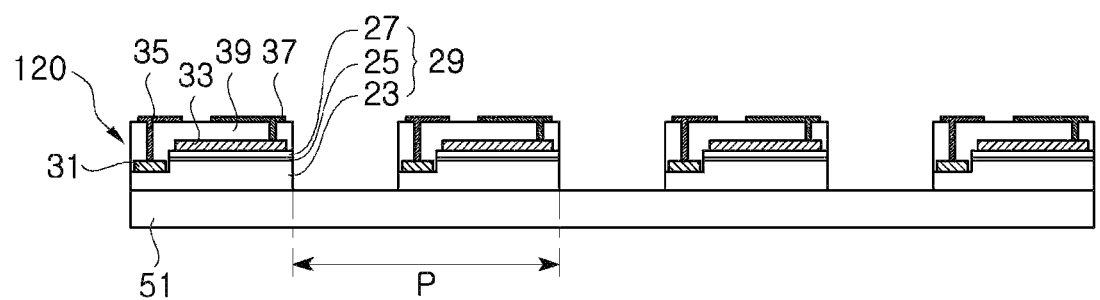
FIGS. 1A, 1B, 1C, 1D, 1E, 1F, 1G, and 1H are views illustrating a method of transferring a light emitting diode chip of a display apparatus to a substrate according to a first exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described in detail with reference to the accompanying drawings.

FIGS. 1A to 1H are views illustrating a method of transferring a light emitting diode chip of a display apparatus to a substrate according to a first exemplary embodiment.

Referring to FIG. 1A to 1H, the method of transferring a light emitting diode chip 120 to a substrate 110 in the display apparatus according to the first exemplary embodiment will be described.

Referring to FIG. 1A, a plurality of light emitting diode chips 120 are disposed on a first manufacturing substrate 51. The plurality of light emitting diode chips 120 may be formed separately and transferred to the first manufacturing substrate 51, or the plurality of light emitting diode chips 120 may be grown and manufactured on the first manufacturing substrate 51. The first manufacturing substrate 51 may have an insulating material as the substrate 110, and may have a predetermined thickness.

The plurality of light emitting diode chips 120 may be spaced apart from one another at a predetermined interval P on the first manufacturing substrate 51. In this case, the interval P between the light emitting diode chips 120 may correspond to an interval between subpixels of the display apparatus.

Each of the light emitting diode chips 122 may emit light in response to an external power source applied thereto, and include a light emitting structure 29, an n-type electrode 31, a p-type electrode 33, an n-type bump 35, a p-type bump 37, and an encapsulant 39. The light emitting structure 29 may include an n-type semiconductor layer 23, an active layer 25, and a p-type semiconductor layer 27.

Each of the n-type semiconductor layer 23, the active layer 25, and the p-type semiconductor layer 27 may include Group III-V based compound semiconductors. For example, each of the n-type semiconductor layer 23, the active layer 25, and the p-type semiconductor layer 27 may include nitride semiconductors, such as (Al, Ga, In)N. The n-type semiconductor layer 23 may be interchangeably placed with the p-type semiconductor layer 27.

The n-type semiconductor layer 23 may be a conductive semiconductor layer including n-type dopants (for example, Si), and the p-type semiconductor layer 27 may be a conductive semiconductor layer including p-type dopants (for example, Mg). The active layer 25 interposed between the n-type semiconductor layer 23 and the p-type semiconductor layer 27, and may include a multi-quantum well (MQW) structure. The composition of the active layer 25 may be determined to emit light having a desired peak wavelength.

The light emitting structure 29 may have a structure, in which the n-type semiconductor layer 23, the active layer 25, and the p-type semiconductor layer 27 are sequentially stacked one over another. In addition, a portion of the n-type semiconductor layer 23 may be exposed upward by partially removing the p-type semiconductor layer 27 and the active layer 25.

The p-type electrode 33 is disposed over the p-type semiconductor layer 27 to be electrically connected to the p-type semiconductor layer 27, and the n-type electrode 31 is disposed over the exposed portion of the n-type semiconductor layer 23 to be electrically connected to the n-type semiconductor layer 23. More particularly, the light emitting diode chip 122 according to the illustrated exemplary embodiment may have a horizontal structure, in which the n-type electrode 31 and the p-type electrode 33 are arranged in the same direction.

The encapsulant 39 may be disposed on an upper portion of the light emitting structure 29 to cover the n-type electrode 31, the p-type electrode 33, and the light emitting structure 29. The encapsulant 39 has electrically insulating properties and may protect the light emitting structure 29, the n-type electrode 31, and the p-type electrode 33 from external environments. According to an exemplary embodiment, the encapsulant 39 may be formed of a transparent material. Alternatively, the encapsulant 39 may be formed of an opaque material or a translucent material. The encapsulant 39 may have substantially the same width as the light emitting structure 29.

Each of the n-type bump 35 and the p-type bump 37 may be disposed to cover a portion of an upper surface of the encapsulant 39. The n-type bump 35 may be electrically connected to the n-type electrode 31, and the p-type bump 37 may be electrically connected to the p-type electrode 33 through via-holes passing through the encapsulant 39. The n-type bump 35 and the p-type bump 37 are spaced apart from each other on the upper surface of the encapsulant 39 to be electrically insulated from each other.

Figure 1B:
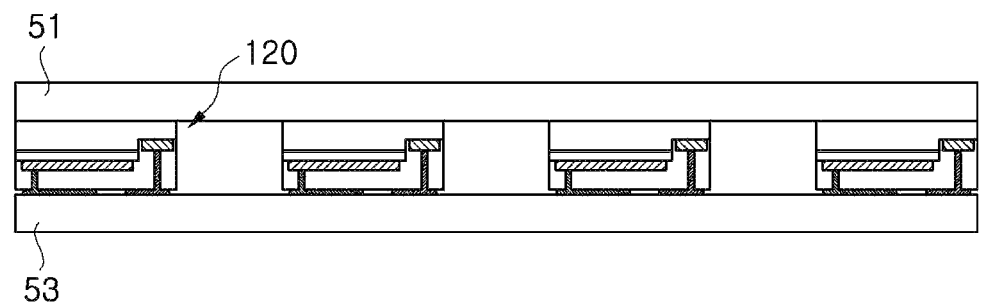

When the plurality of light emitting diode chips 120 is disposed on the first manufacturing substrate 51 as described above, the first manufacturing substrate 51 is turned upside down and the plurality of light emitting diode chips 120 are coupled to a second manufacturing substrate 53 as shown in FIG. 1B. Accordingly, the n-type bumps 35 and the p-type bumps 37 of the plurality of light emitting diode chips 120 are in contact with the second manufacturing substrate 53.

Figure 1C:
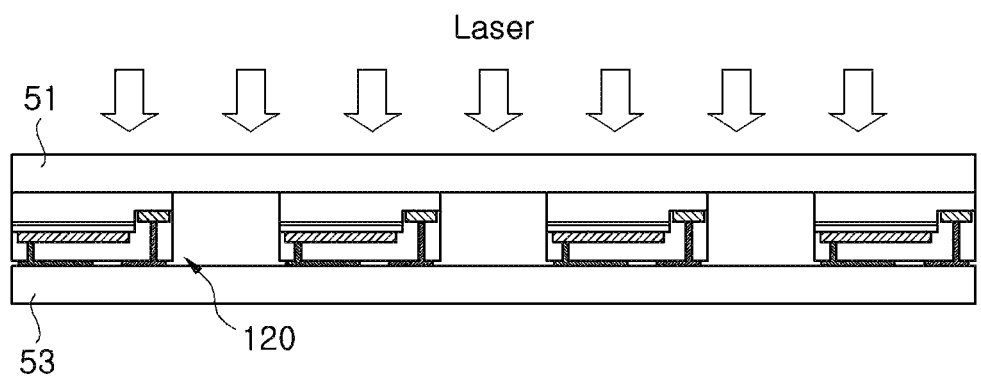

As shown in FIG. 1C, the first manufacturing substrate 51 is irradiated with a laser. As such, the first manufacturing substrate 51 and the plurality of light emitting diode chips 120 may be separated by the irradiation process.

Figure 1D:
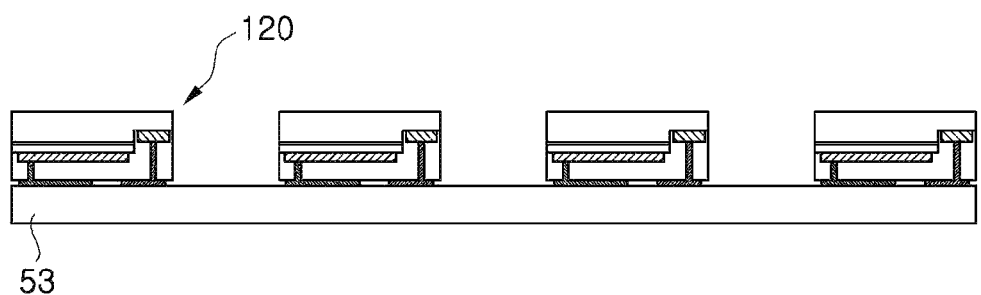

Thus, as shown in FIG. 1D, the plurality of light emitting diode chips 120 may be transferred to the second manufacturing substrate 53.

Figure 1E:
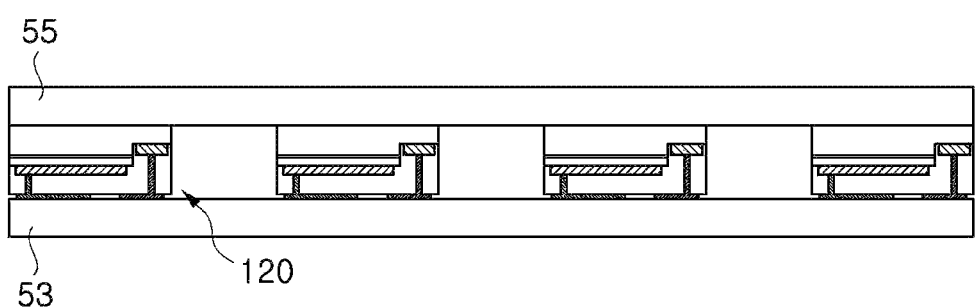
Figure 1F:
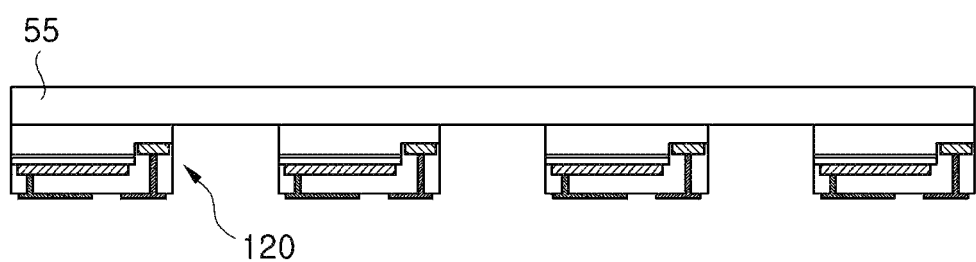

Referring to FIG. 1E, a third manufacturing substrate 55 is coupled to an upper portion of the plurality of light emitting diode chips 120. When the third manufacturing substrate 55 is coupled to the plurality of light emitting diode chips 120, the second manufacturing substrate 53 is removed as shown in FIG. 1F.

The second manufacturing substrate 53 and the third manufacturing substrate 55 may be substantially the same as the first manufacturing substrate 51.

Figure 1G:
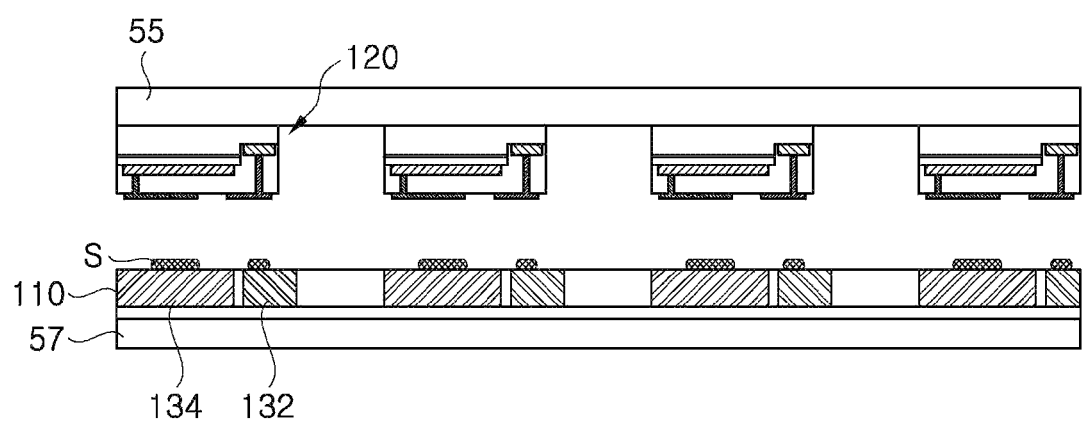

Referring to FIG. 1G, the plurality of light emitting diode chips 120 coupled to the third manufacturing substrate 55 may be transferred to the substrate 110. The substrate 110 is provided to support the light emitting diode chip 120. The substrate 110 may have an insulating material, and may have a predetermined thickness.

The substrate 110 may include a first substrate electrode 132 and a second substrate electrode 134 formed thereon. The first substrate electrode 132 may extend from an upper surface of the substrate 110 to a lower surface thereof, and the second substrate electrode 134 may extend from the upper surface of the substrate 110 to the lower surface thereof. The first substrate electrode 132 and the second substrate electrode 134 may be spaced apart and electrically insulated from each other.

The substrate 110 may further include a fourth manufacturing substrate 57 disposed under the substrate 110, and a buffer layer may be formed between the substrate 110 and the fourth manufacturing substrate 57. The fourth manufacturing substrate 57 may have substantially the same material as the first manufacturing substrate 51, and may be used in a subsequent process.

A bonding portion S may be applied on the first substrate electrode 132 and the second substrate electrode 134.

Figure 1H:
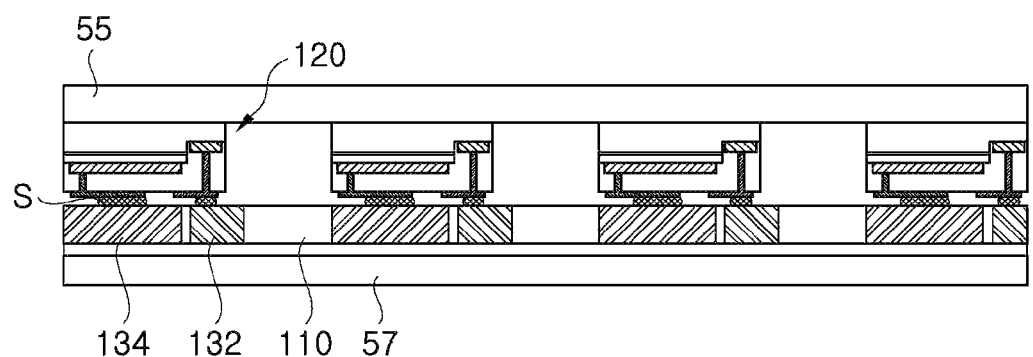

Accordingly, the p-type bumps 37 and the n-type bumps 35 of the light emitting diode chip 120, as shown in FIG. 1H, are electrically coupled to the first substrate electrode 132 and the second substrate electrode 134, respectively. When the light emitting diode chip 120 is coupled to the substrate 110, the third manufacturing substrate 55 disposed over the plurality of light emitting diode chips 120 may be removed.

FIGS. 2A to 2I are views illustrating a method of transferring a light emitting diode chip of a display apparatus to a substrate according to a second exemplary embodiment.

Referring to FIGS. 2A to 2I, the method of transferring a light emitting diode chip 120 to the substrate 110 in the display apparatus according to the second exemplary embodiment will be described.

Figure 2A:
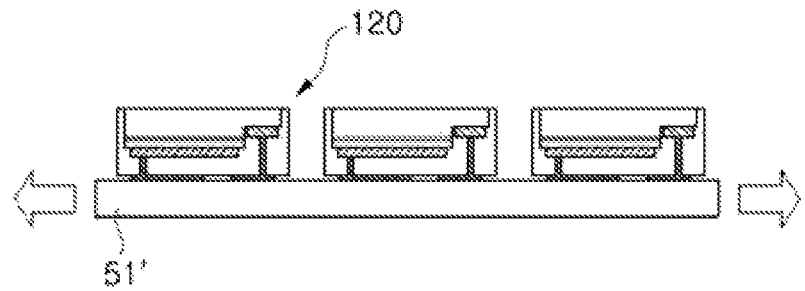
FIGS. 2A, 2B, 2C, 2D, 2E, 2F, 2G, 2H, and 2I are views illustrating a method of transferring a light emitting diode chip of a display apparatus to a substrate according to a second exemplary embodiment.

Referring to FIG. 2A, a plurality of light emitting diode chips 120 are disposed on a first manufacturing substrate 51'. In the illustrated exemplary embodiment, the first manufacturing substrate 51' may have a material different from the first manufacturing substrate 51 described above with reference to FIG. 1A. The process of disposing the plurality of light emitting diode chips 120 on the first manufacturing substrate 51' of the illustrated exemplary embodiment may be performed after the process shown with reference to FIGS. 1A to 1D.

The first manufacturing substrate 51' may be formed of an insulating material having elasticity. The first manufacturing substrate 51' may be elongated in the longitudinal direction. Accordingly, a distance between the plurality of light emitting diode chips 120 may become greater.

Figure 2B:
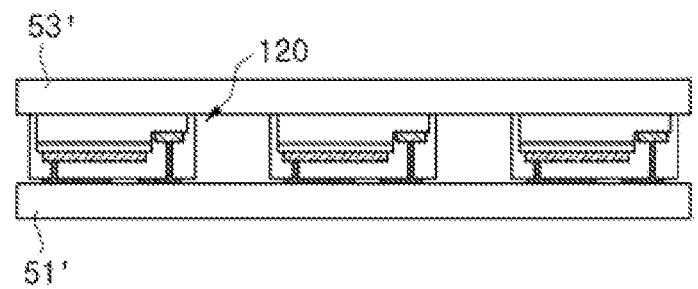

In this state, as shown in FIG. 2B, a second manufacturing substrate 53' is coupled to an upper portion of the plurality of light emitting diode chips 120. In this case, the second manufacturing substrate 53' may have an insulating material having elasticity as the first manufacturing substrate 51'.

Figure 2C:
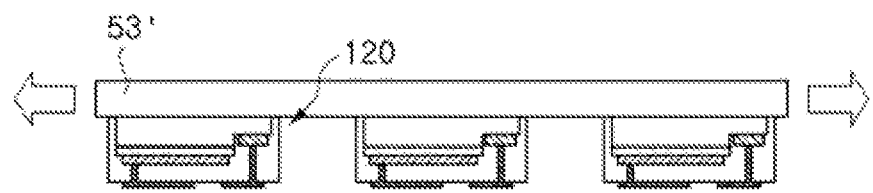

Referring to FIG. 2C, the first manufacturing substrate 51' is separated from the plurality of light emitting diode chips 120, the second manufacturing substrate 53' is elongated in the longitudinal direction, such that a distance between the plurality of light emitting diode chips may be increased.

Figure 2D:
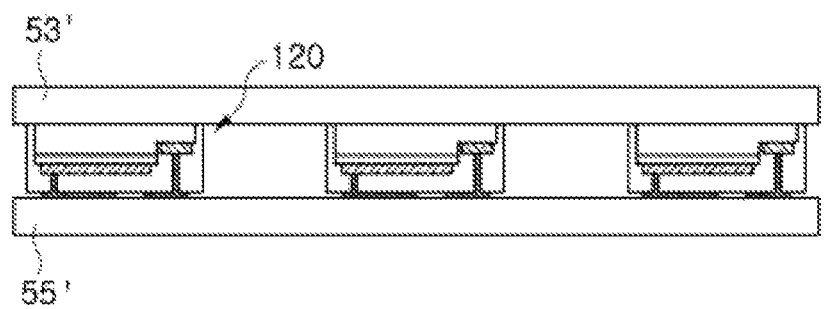

While the distance between the plurality of light emitting diode chips 120 is increased by elongating the second manufacturing substrate 53', as shown in FIG. 2D, a third manufacturing substrate 55' having elasticity is coupled to the plurality of light emitting diode chips 120.

Figure 2E:
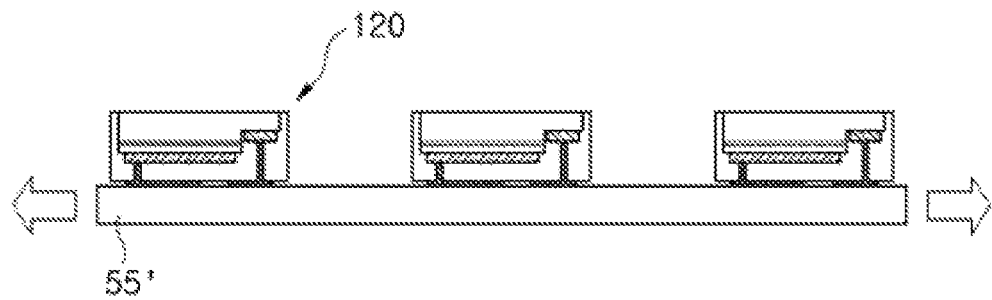

Then, as shown in FIG. 2E, the second manufacturing substrate 53' is separated from the plurality of light emitting diode chips 120, and the third manufacturing substrate 55' is elongated in the longitudinal direction to increase the distance between the plurality of light emitting diode chips 120. In this case, the third manufacturing substrate 55' may have an insulating material having elasticity, as in the first manufacturing substrate 51'.

Figure 2F:
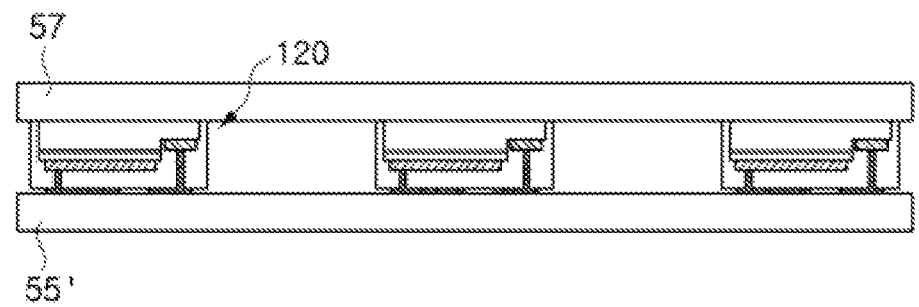
Figure 2G:
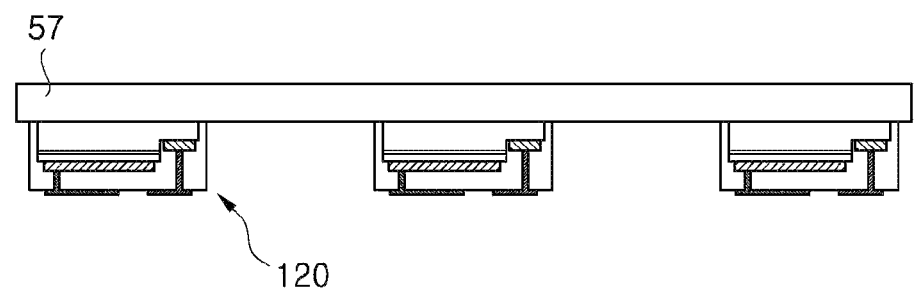
Figure 2H:
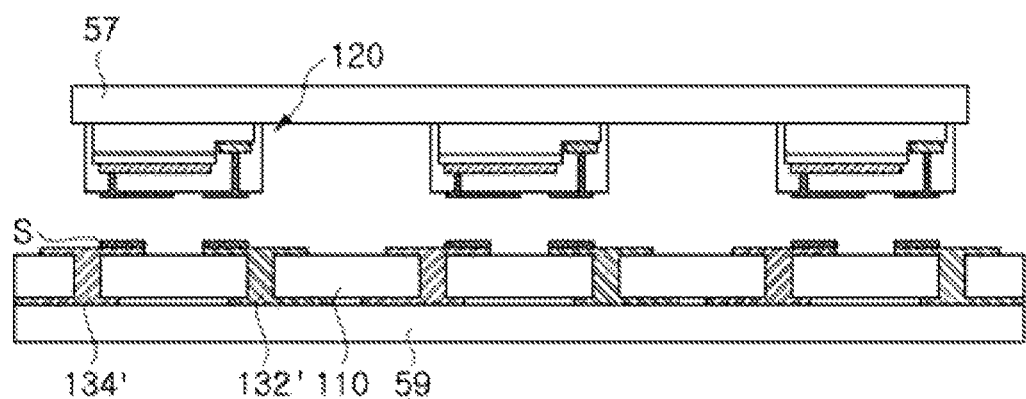

While the third manufacturing substrate 55' is elongated, as shown in FIG. 2F, a fourth manufacturing substrate 57 is coupled to the plurality of light emitting diode chips 120. Then, as shown in FIG. 2G, the third manufacturing substrate 55' is separated.

While the plurality of light emitting diode chips 120 are coupled to the fourth manufacturing substrate 57, the fourth manufacturing substrate 57 may be coupled onto the substrate 110. In this case, a first substrate electrode 132' and a second substrate electrode 134' may be disposed on the substrate 110 as in the first exemplary embodiment. However, the first substrate electrode 132' and the second electrode 134' have shapes different from those of the first exemplary embodiment. The first substrate electrode 132' extends from the upper surface of the substrate 110 to the lower surface thereof through the substrate 110. A portion of the first substrate electrode 132' is disposed on the upper surface of the substrate 110 and another portion of the first substrate electrode 132' is disposed on the lower surface of the substrate 110, such that both portions of the first substrate electrode 132' are electrically connected to each other through a via-hole formed in the substrate 110. As in the first substrate electrode 132', portions of the second substrate electrode 134' are disposed on the upper and lower surfaces of the substrate 110, respectively, and are electrically connected to each other through the via-hole formed in the substrate 110. In this case, the first substrate electrode 132' may be spaced apart from the second substrate electrode 134' to be electrically insulated from each other.

The first substrate electrode 132' and the second substrate electrode 134' disposed on the upper surface of the substrate 110 may be electrically connected to an n-type bump 35 and a p-type bump 37, respectively, and a bonding portion S may be applied on the first substrate electrode 132' and the second substrate electrode 134' to be electrically coupled to the n-type bump 35 and the p-type bump 37, respectively.

Figure 2I:
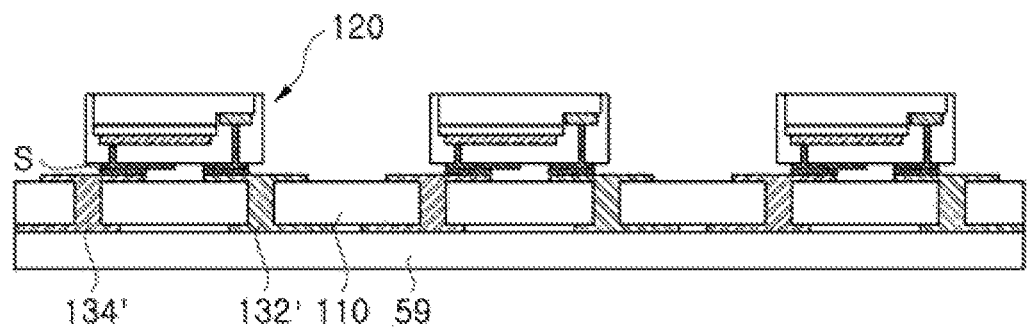

When the plurality of light emitting diode chips 120 are coupled to the substrate 110, the fourth manufacturing substrate 57, as shown in FIG. 2I, may be removed. A fifth manufacturing substrate 59 may be disposed under the substrate 110, and a buffer layer may be disposed between the substrate 110 and the fifth manufacturing substrate 59.

FIGS. 3A to 3I are views illustrating a method of transferring a light emitting diode chip of a display apparatus to a substrate according to a third exemplary embodiment.

Referring to FIGS. 3A to 3I, the method of transferring a light emitting diode chip 120 to the substrate 110 in the display apparatus according to the third exemplary embodiment will be described.

Figure 3A:
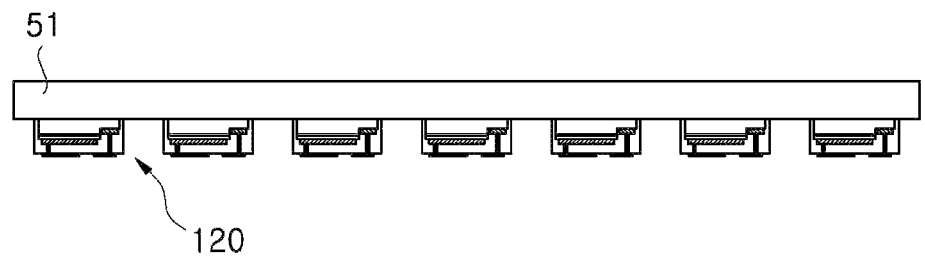
FIGS. 3A, 3B, 3C, 3D, 3E, 3F, 3G, 3H, and 3I are views illustrating a method of transferring a light emitting diode chip of a display apparatus to a substrate according to a third exemplary embodiment.

Referring to FIG. 3A, a plurality of light emitting diode chips 120 are disposed on a first manufacturing substrate 51. In the illustrated exemplary embodiment, the first manufacturing substrate 51 on which the plurality of light emitting diode chips 120 are disposed is substantially the same as that of FIG. 1A, but FIG. 3A may be an inverted view showing the light emitting diode chip 120 rotated by 180 degrees.

Figure 3B:
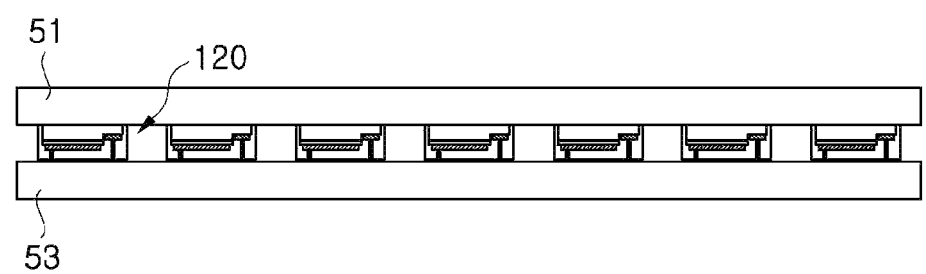
Figure 3C:
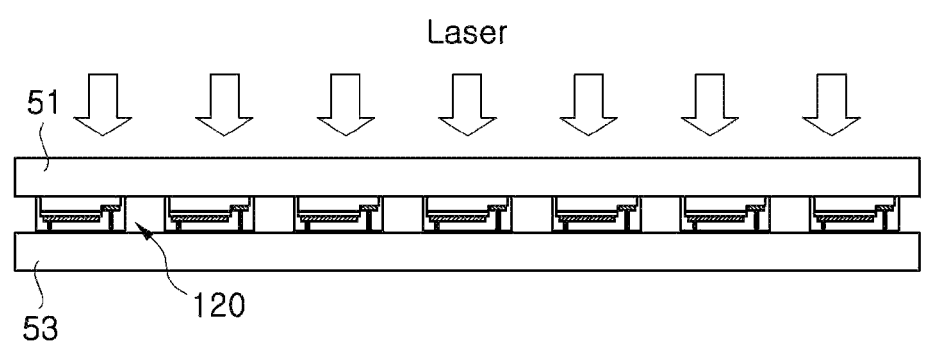

As shown in FIG. 3B, a second manufacturing substrate 53 is coupled to a lower portion of the plurality of light emitting diode chips 120, and irradiation is performed over the first manufacturing substrate 51 with a laser as shown in FIG. 3C. Accordingly, the plurality of light emitting diode chips 120 and the first manufacturing substrate 51 may be separated from each other.

Figure 3D:
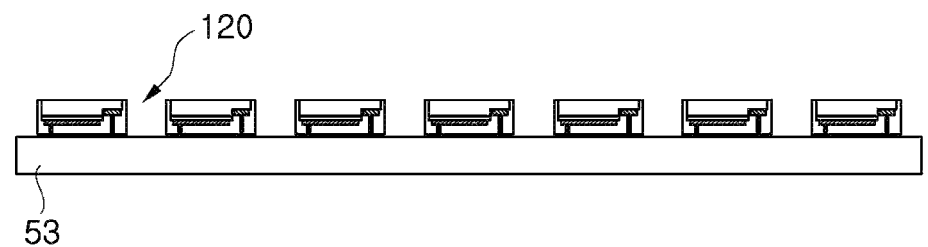

FIG. 3D shows a state in which the plurality of light emitting diode chips 120 and the first manufacturing substrate 51 are separated from each other.

Figure 3E:
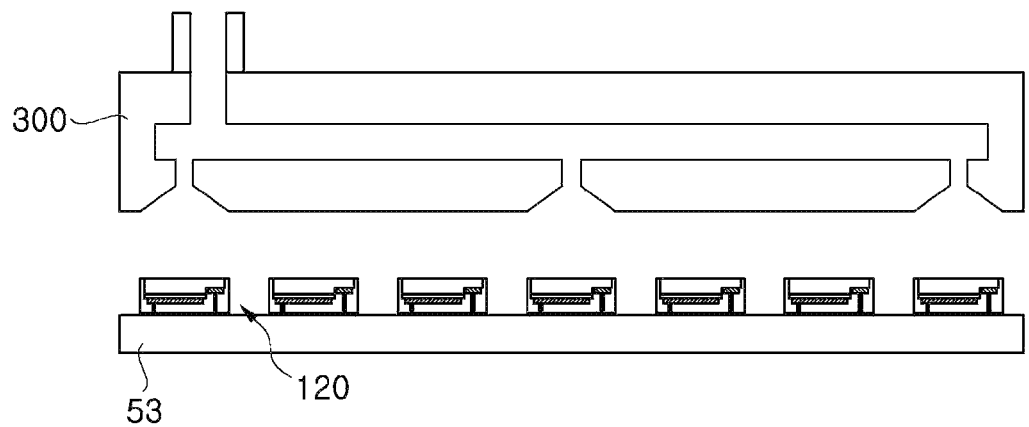

Referring to FIG. 3E, when the plurality of light emitting diode chips 120 are mounted on the second manufacturing substrate 53, a transfer device 300 is placed above the light emitting diode chips 120 to transfer a portion of the plurality of light emitting diode chips 120. The transfer device 300 may transfer the light emitting diode chips 120 from the second manufacturing substrate 53 to another location by absorbing the light emitting diode chips 120 disposed at predetermined intervals. In this case, the transfer device 300 may absorb the portion of the plurality of light emitting diode chips 120 disposed on the second manufacturing substrate 53 to be transferred.

For example, the transfer device 300 may absorb one of the three adjacent light emitting diode chips 120 for transfer, however, the inventive concepts are not limited to a particular number of the light emitting diode chips 120 to be transferred by the transfer device 300.

Figure 3F:
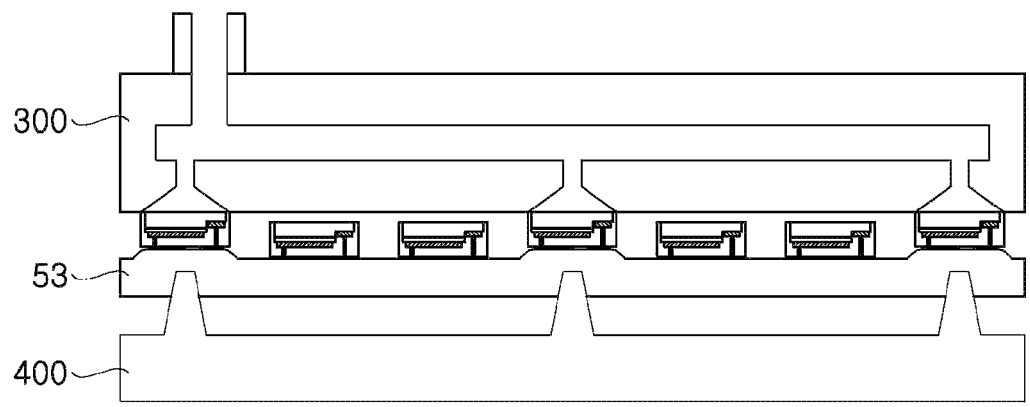

Then, as shown in FIG. 3F, when the transfer device 300 absorbs the plurality of light emitting diode chips 120, a heater 400 may be operated under the corresponding light emitting diode chip 120. The heater 400 may apply heat to cause ultrasonic-vibration in the second manufacturing substrate 53 on which the light emitting diode chip 120 is disposed, to separate the light emitting diode chip 120 absorbed by the transfer device 300 from the second manufacturing substrate 53.

Figure 3G:
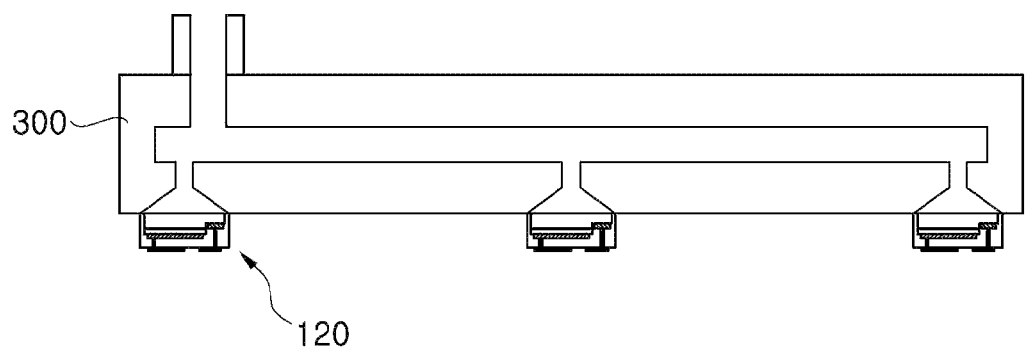

Then, as shown in FIG. 3G, the plurality of light emitting diode chips 120 may be absorbed to the transfer device 300.

Figure 3H:
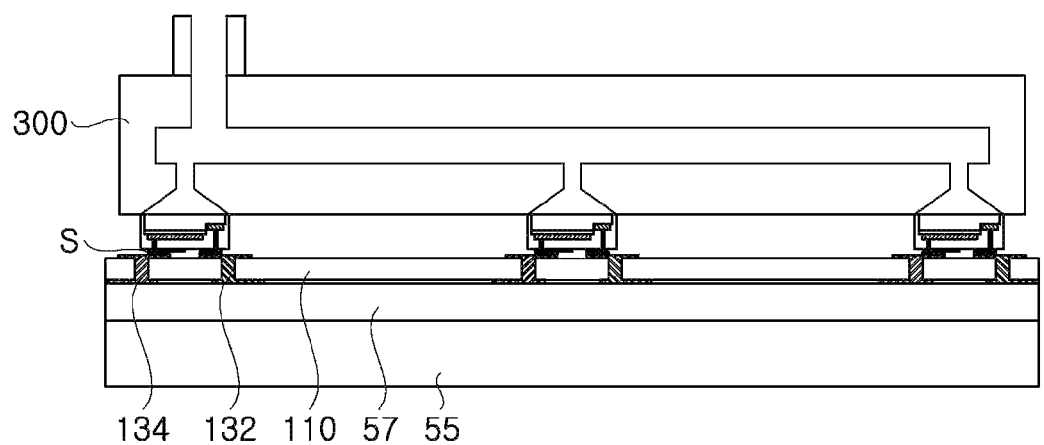

The plurality of light emitting diode chips 120 absorbed to the transfer device 300 may be moved, and coupled to the substrate 110 as shown in FIG. 3H. In this case, a first substrate electrode 132 and a second substrate electrode 134 may be disposed on the substrate 110. In addition, a third manufacturing substrate 55 and a fourth manufacturing substrate 57 may be coupled to a lower portion of the substrate 110.

Figure 3I:
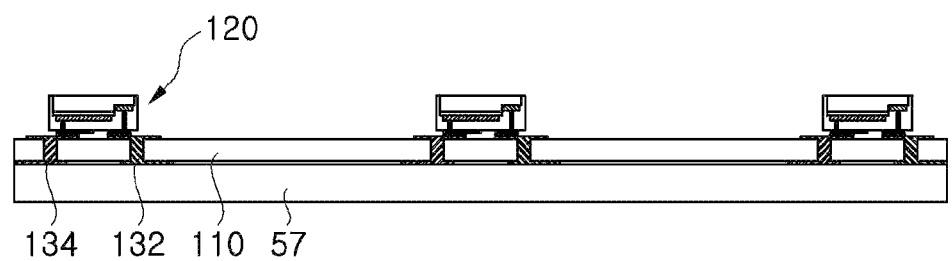

Then, as shown in FIG. 3I, the transfer device 300 is separated from the plurality of light emitting diode chips 120 coupled onto the substrate 110. In addition, the third manufacturing substrate 55 coupled to the lower portion of the fourth manufacturing substrate 57 may be heated, for example, to be separated.

In the illustrated exemplary embodiment, each of the second manufacturing substrate 53, the third manufacturing substrate 55, and the fourth manufacturing substrate 57 may be substantially the same as the first manufacturing substrate 51 of the first exemplary embodiment. Moreover, the third manufacturing substrate 55 may withstand the pressure that may be generated when the plurality of light emitting diode chips 120 are coupled to the substrate 110 from the transfer device 300.

FIGS. 4A to 4I are views illustrating a method of transferring a light emitting diode chip of a display apparatus to a substrate according to a fourth exemplary embodiment.

Referring to FIGS. 4A to 4I, the method of transferring a light emitting diode chip 120 to the substrate 110 in the display apparatus according to the fourth exemplary embodiment will be described.

Figure 4A:
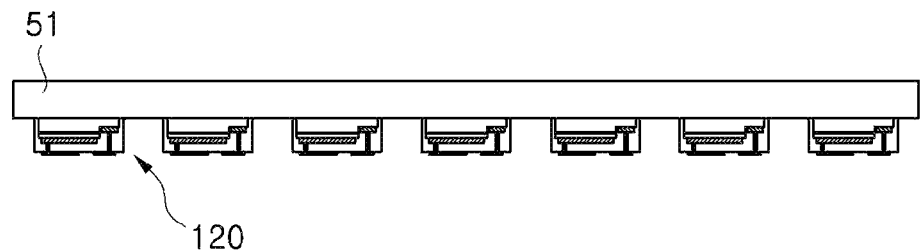
FIGS. 4A, 4B, 4C, 4D, 4E, 4F, 4G, 4H, and 4I are views illustrating a method of transferring a light emitting diode chip of a display apparatus to a substrate according to a fourth exemplary embodiment.
Figure 4B:
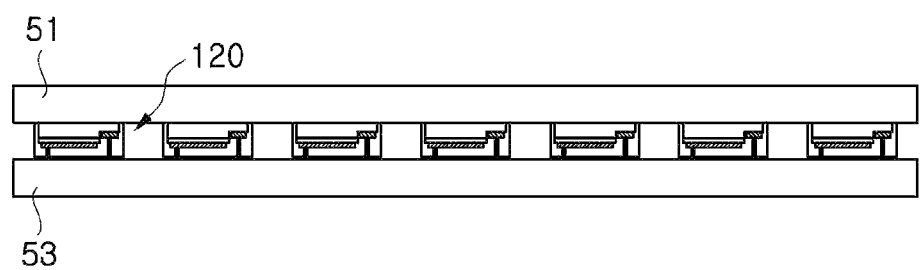
Figure 4C:
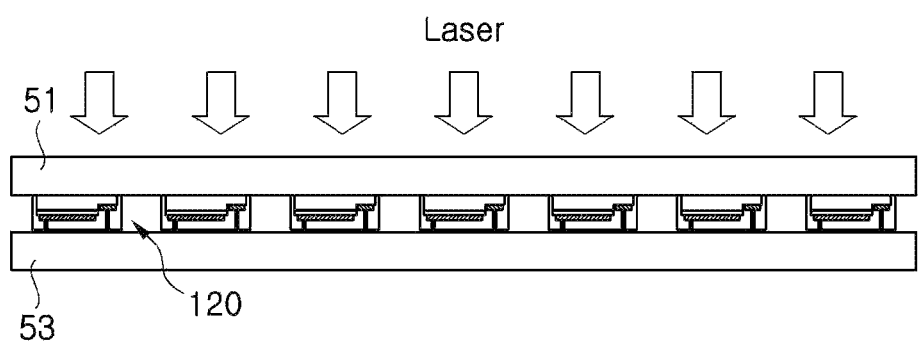
Figure 4D:
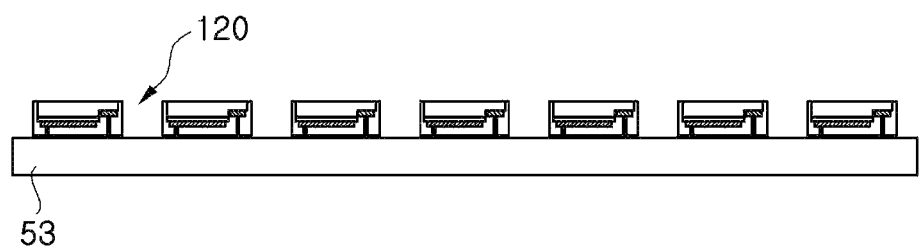

Referring to FIG. 4A, a plurality of light emitting diode chips 120 are disposed on a first manufacturing substrate 51. The processes illustrated in FIGS. 4A to 4D are substantially the same as in the third exemplary embodiment, and thus, repeated descriptions thereof will be omitted to avoid redundancy.

Figure 4E:
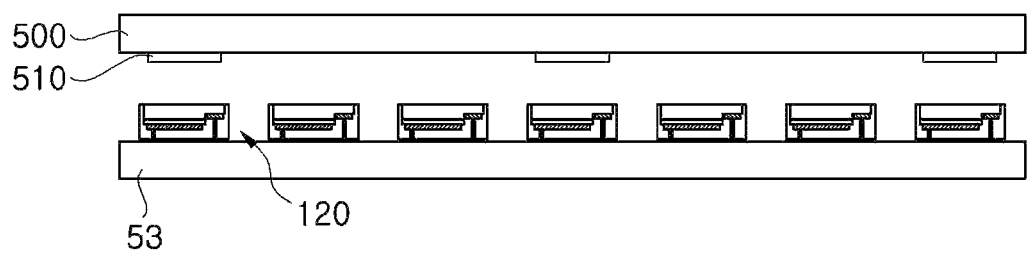
Figure 4F:
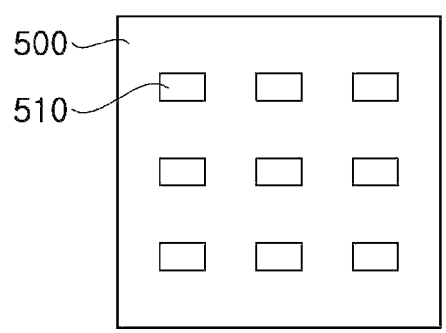

Referring to FIG. 4E, the plurality of light emitting diode chips 120 are disposed on a second manufacturing substrate 53, and a transferring plate 500 is placed above the light emitting diode chips 120. The transferring plate 500 performs substantially the same function as the transfer device 300 in the third exemplary embodiment. However, the transferring plate 500 according to the illustrated exemplary embodiment may include a plurality of adhesive transferring portions 510. Accordingly, a portion of the plurality of light emitting diode chips 120 is bonded to the adhesive transferring portion 510, and is coupled to the transferring plate 500. The plurality of adhesive transferring portions 510 may be regularly disposed in the transferring plate 500 according to rows and columns, as shown in FIG. 4F.

Figure 4G:
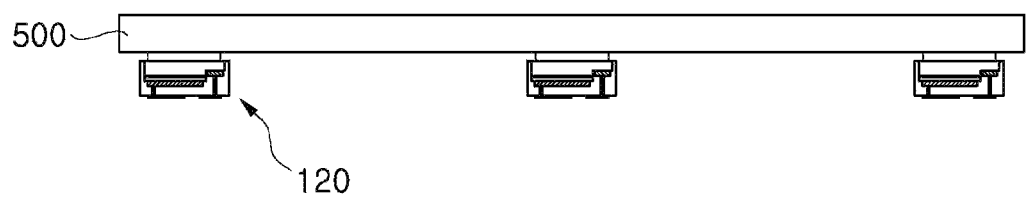

Then, the plurality of light emitting diode chips are coupled to the transferring plate 500 as shown in FIG. 4G.

Figure 4H:
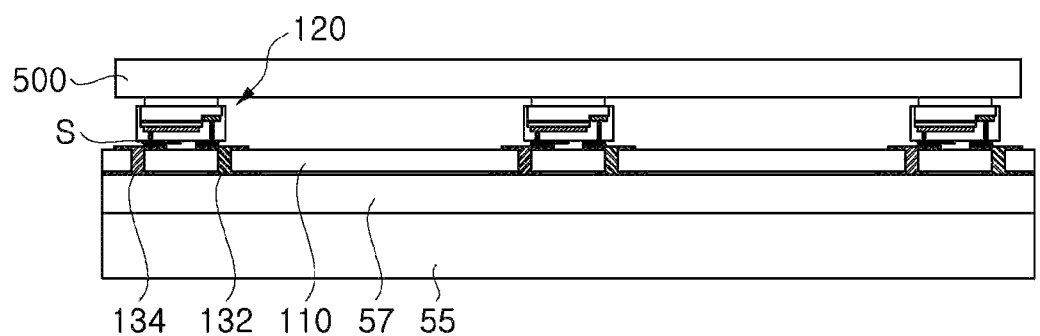
Figure 4I:
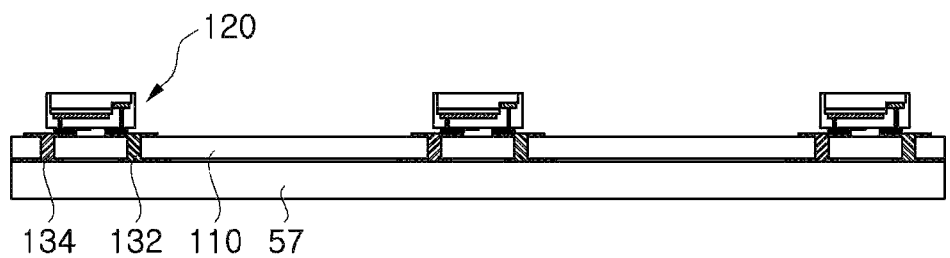

The plurality of light emitting diode chips 120 bonded to the transferring plate 500, as shown in FIG. 4H, may be moved and coupled to the substrate 110. Then, as shown in FIG. 4I, the plurality of light emitting diode chips 120 coupled to the substrate 100 may be separated from the transferring plate 500. The substrate 110 is substantially the same as that in the third exemplary embodiment, and thus, repeated descriptions thereof will be omitted.

FIGS. 5A to 5D are views illustrating a method of transferring a light emitting diode chip of a display apparatus to a substrate according to a fifth exemplary embodiment.

Referring to FIGS. 5A to 5D, the method of transferring a light emitting diode chip 120 to the substrate 110 in the display apparatus according to the fifth exemplary embodiment will be described.

Figure 5A:
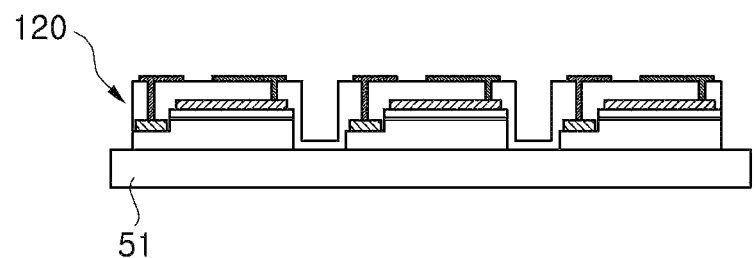
FIGS. 5A, 5B, 5C, and 5D are views illustrating a method of transferring a light emitting diode chip of a display apparatus to a substrate according to a fifth exemplary embodiment.

Referring to FIG. 5A, a plurality of light emitting diode chips 120 are disposed on a first manufacturing substrate 51. In the illustrated exemplary embodiment, the plurality of light emitting diode chips 120 may be substantially the same as those of the first exemplary embodiment. However, when the light emitting diode chips 120 are grown and manufactured on the first manufacturing substrate 51, an encapsulant 39 of the light emitting diode chip 120 may be connected to an adjacent light emitting diode chip 120, as shown in FIG. 5A.

Figure 5B:
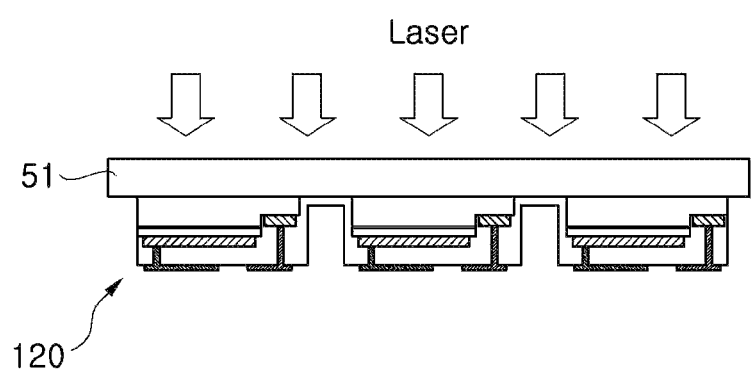

Then, as shown in FIG. 5B, the first manufacturing substrate 51 on which the plurality of light emitting diode chips 120 are disposed may be inverted to be irradiated with a laser over the first manufacturing substrate 51. Accordingly, the first manufacturing substrate 51 and each light emitting diode chip 120 may be partially separated. At this time, one of the semiconductor layers of the light emitting diode chip 120 that contacts the first manufacturing substrate 51 may be separated from the first manufacturing substrate 51 by irradiation with a laser, but each light emitting diode chip 120 may not be completely separated from the first manufacturing substrate 51, since the encapsulant 39 is connected with the adjacent light emitting diode chip 120.

Figure 5C:
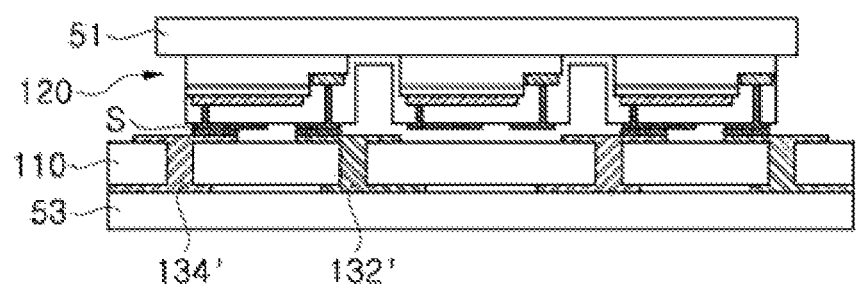

In this state, referring to FIG. 5C, the first manufacturing substrate 51 is disposed on the substrate 110, so that a portion of the plurality of light emitting diode chips 120 is coupled to the substrate 110. At this time, a first substrate electrode 132' and a second substrate electrode 134' are disposed on the substrate 110 as in the second exemplary embodiment, and a bonding portion S may be applied on the first substrate electrode 132' and the second substrate electrode 134'. As such, the light emitting diode chip 120 in contact with the first substrate electrode 132' and the second substrate electrode 134' of the substrate 110 may be coupled onto the substrate 110.

More particularly, as shown in FIG. 5C, a plurality of first substrate electrodes 132' and the second substrate electrodes 134' disposed on the substrate 110 is not disposed at the same interval as that of the plurality of light emitting diode chips 120 disposed on the first manufacturing substrate 51. The plurality of first substrate electrodes 132' and the second substrate electrodes 134' may be disposed at an interval greater than that of the plurality of light emitting diode chips 120 disposed on the first manufacturing substrate 51. Accordingly, when the first manufacturing substrate 51 and the substrate 110 face each other, a portion of the plurality of light emitting diode chips 120 disposed on the first manufacturing substrate 51 may be disposed on the substrate 110.

In this case, since the bonding portion S is applied on the first substrate electrode 132' and the second substrate electrode 134', only the plurality of light emitting diode chips 120 coupled to the bonding portion S are coupled onto the substrate 110. The drawings show that only one of the two light emitting diode chips 120 is coupled onto the substrate 110, however, the inventive concepts are not limited thereto.

Figure 5D:
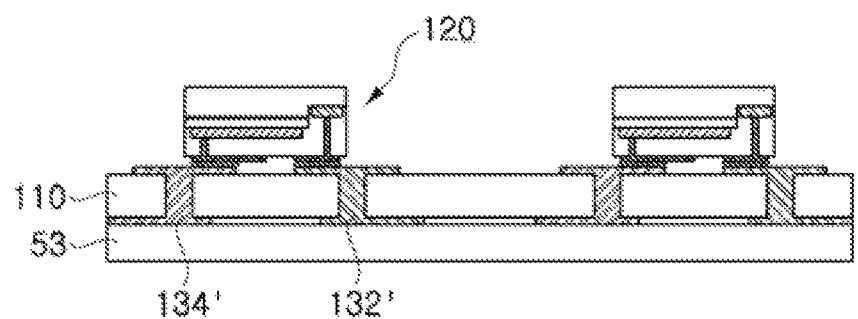

Then, as shown in FIG. 5D, the plurality of light emitting diode chips 120 may be disposed on the substrate 110. In this case, an interval of the plurality of light emitting diode chips 120 disposed on the substrate 110 may correspond to an interval between sub-pixels of the display apparatus.

In addition, the substrate 110 according to the illustrated exemplary embodiment is substantially the same as the substrate 110 in the second exemplary embodiment through the fourth exemplary embodiment, and thus, repeated descriptions thereof will be omitted.

FIGS. 6A to 6G are views showing a method of manufacturing a light emitting diode chip according to an exemplary embodiment.

A process of manufacturing a light emitting diode chip 120 on a first manufacturing substrate 51 in the display apparatus will be described with reference to FIGS. 6A to 6G.

In FIGS. 6A through 6G, images shown on the right side are plan views of corresponding cross-sectional views shown on the left side.

Figure 6A:
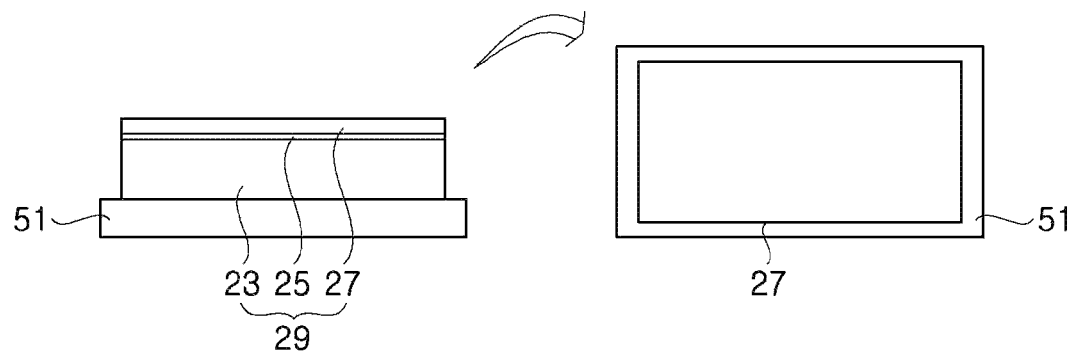
FIGS. 6A, 6B, 6C, 6D, 6E, 6F, and 6G are views illustrating a method of manufacturing a light emitting diode chip according to an exemplary embodiment.

Referring to FIG. 6A, an n-type semiconductor layer 23, an active layer 25, and a p-type semiconductor layer 27 are grown on the first manufacturing substrate 51.

Figure 6B:
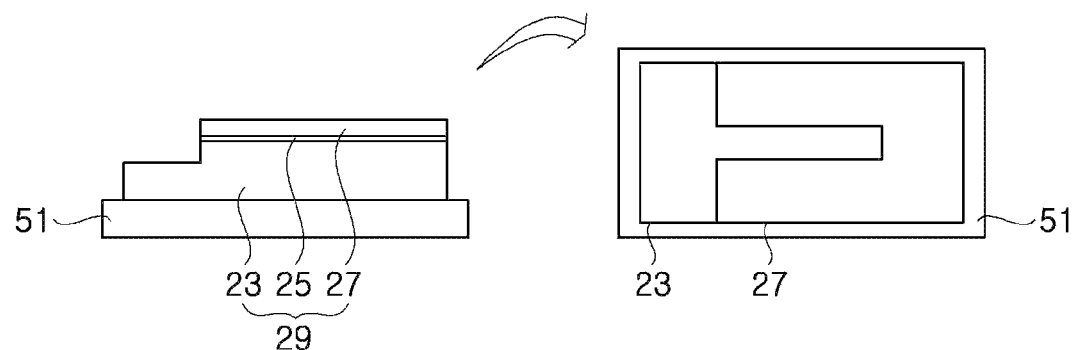

Subsequently, as shown in FIG. 6B, the active layer 25 and the p-type semiconductor layer 27 are partially removed to expose the n-type semiconductor layer 23. In this case, the n-type semiconductor layer 23 exposed in an upward direction may have substantially a T-shape in plan view, as shown in FIG. 6B.

Figure 6C:
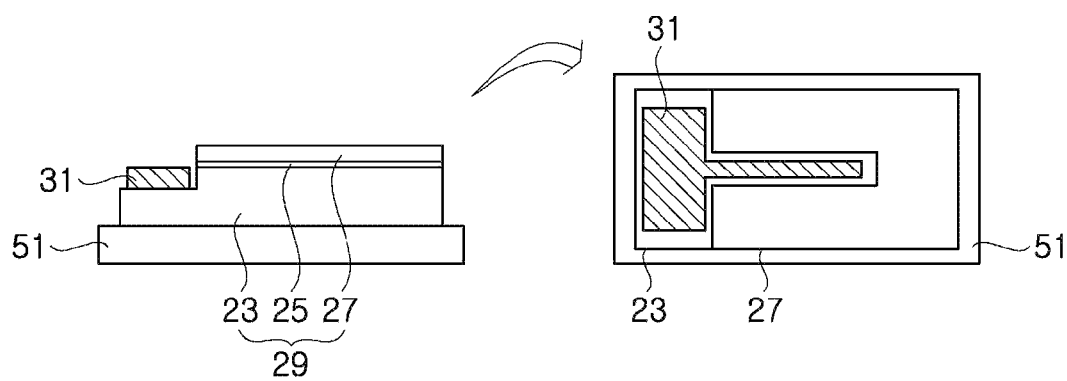

Then, an n-type electrode 31 is formed on the exposed n-type semiconductor layer 23 as shown in FIG. 6C. The n-type electrode 31 may also be formed in substantially a T-shape as the exposed n-type semiconductor layer 23. The n-type electrode 31 may be spaced apart from the active layer 25 and the p-type semiconductor layer 27 to be insulated therefrom.

Figure 6D:
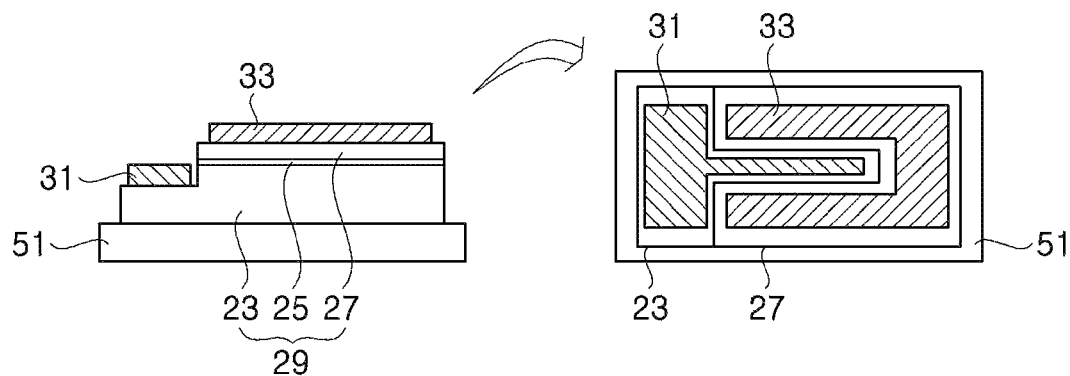

Next, as shown in FIG. 6D, a p-type electrode 33 is formed over the p-type semiconductor layer 27. In this case, the p-type electrode 33 may be formed in substantially a left-opened rectangular shape in accordance with the shape of the upper surface of the p-type semiconductor layer 27.

Figure 6E:
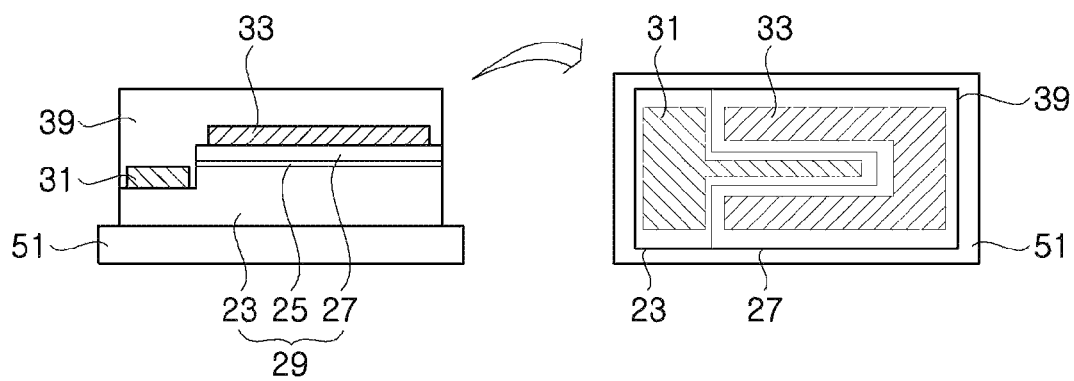

Then, referring to FIG. 6E, an encapsulant 39 may be formed to cover each of the n-type electrode 31, the p-type electrode 33, and the light emitting structure 29. The encapsulant 39 is formed to have substantially the same width as that of the light emitting structure 29. Accordingly, the encapsulant 39 may not cover side surfaces of the light emitting structure 29.

Figure 6F:
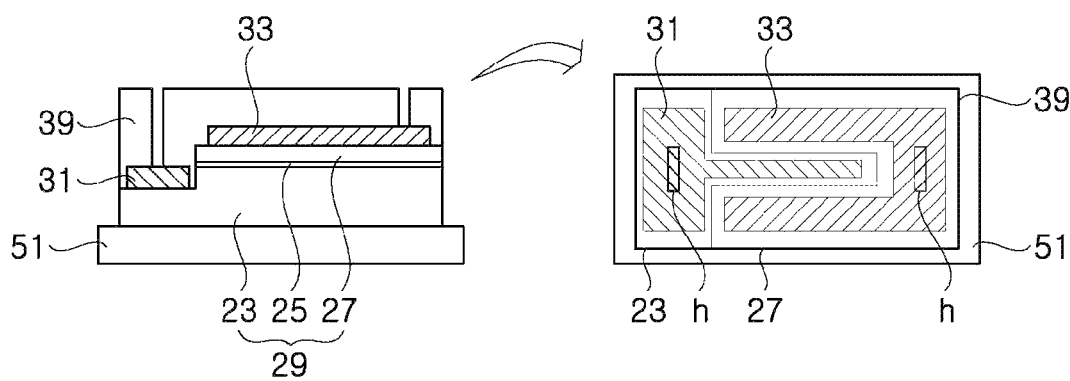

Next, referring to FIG. 6F, a portion of the encapsulant 39 is etched to form a via exposing the n-type electrode 31 and the p-type electrode 33. At this time, the n-type electrode 31 and the p-type electrode 33 exposed through the via may be a portion of the n-type electrode 31 and the p-type electrode 33, respectively.

Figure 6G:
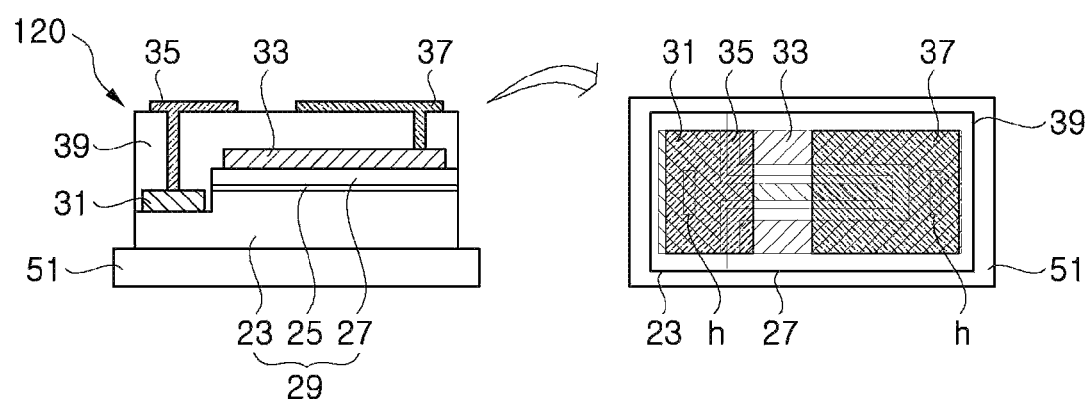

Then, referring to FIG. 6G, an n-type bump 35 and a p-type bump 37 are formed over the encapsulant 39, respectively. The n-type bump 35 is formed over the n-type electrode 31, and the p-type bump 37 is disposed over the p-type electrode 33. The n-type bump 35 may be electrically connected to the n-type electrode 31 through the via formed in the encapsulant 39, and the p-type bump 37 may be electrically connected to the p-type electrode 33 through the via formed in the encapsulant 39.

The light emitting diode chip 120 may be manufactured on the first manufacturing substrate 51 by the manufacturing method according to exemplary embodiments described above.

According to exemplary embodiments, even when luminous area of a light emitting diode chip is reduced and an amount of the supplied current is small, the current density flowing through the light emitting diode chip may be increased.

In addition, by increasing the size of a light emitting diode package to be larger than a size of the light emitting diode chip, the yield of the manufacturing process of a display apparatus and the replacement process may be improved, even when the light emitting diode chip has a small luminous area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
   a substrate extending along a first direction and having a first substrate electrode and a second substrate electrode; and
   a plurality of light emitting sources disposed on the substrate and spaced apart from one another,
   wherein the light emitting source comprises:
   a light emitting structure having an n-type semiconductor layer, an active layer, and a p-type semiconductor layer;
   a p-type electrode disposed on the p-type semiconductor layer and electrically connected to the p-type semiconductor layer; and
   an n-type electrode disposed on the n-type semiconductor layer and electrically connected to the n-type semiconductor layer,
   wherein the first substrate electrode extends from an upper surface of the substrate facing the light emitting sources to a lower surface thereof and is electrically connected to the p-type electrode, the first substrate electrode including an upper portion having a substantially flat top surface and disposed on the upper surface of the substrate and a lower portion disposed on the lower surface of the substrate,
   wherein the second substrate electrode extends from the upper surface of the substrate to the lower surface thereof and is electrically connected to the n-type electrode, the second substrate electrode including an upper portion having a substantially flat top surface and disposed on the upper surface of the substrate and a lower portion disposed on the lower surface of the substrate,
   wherein the upper portion of the first substrate electrode of a first light emitting source and the upper portion of the second substrate electrode of a second light emitting source adjacent to the first light emitting source is spaced apart from each other, and
   wherein a width of the upper portion of the first substrate electrode in the first direction is greater than that of the p-type electrode, and a width of the upper portion of the second substrate electrode in the first direction is greater than that of the n-type electrode.

2. The display apparatus of claim 1, further comprises an encapsulant disposed on an upper surface of the light emitting structure.

3. The display apparatus of claim 2, wherein the encapsulant covers a portion of the n-type electrode and a portion of the p-type electrode.

4. The display apparatus of claim 2, wherein the encapsulant comprises a transparent material.

5. The display apparatus of claim 2, further comprising:
   an n-type bump electrically connected to the n-type electrode and disposed between the n-type electrode and the upper portion of the second substrate electrode; and
   a p-type bump electrically connected to the p-type electrode and disposed between the p-type electrode and the upper portion of the first substrate electrode.

6. The display apparatus of claim 5, wherein the n-type bump and the p-type bump of one of the light emitting sources of are disposed to cover a portion of an upper surface of the encapsulant.

7. The display apparatus of claim 6, wherein in one of the light emitting sources:
   the p-type electrode and the n-type electrode are spaced apart by a first distance;
   the n-type bump and the p-type bump are spaced apart by a second distance greater than the first distance;
   the upper portions of the first and second substrate electrodes are spaced apart by a third distance greater than the second distance; and
   the lower portions of the first and second substrate electrodes are spaced apart by a fourth distance greater than the third distance.

* * * * *